(12) United States Patent
Sakamoto et al.

(10) Patent No.: US 8,203,133 B2
(45) Date of Patent: Jun. 19, 2012

(54) SWITCHING ELEMENT, RECONFIGURABLE LOGIC INTEGRATED CIRCUIT AND MEMORY ELEMENT

(75) Inventors: Toshitsugu Sakamoto, Tokyo (JP); Hisao Kawaura, Tokyo (JP); Hiroshi Sunamura, Tokyo (JP); Naoki Banno, Tokyo (JP)

(73) Assignee: NEC Corporation, Tokyo (JP)

( * ) Notice: Subject to any disclaimer, the term of this patent is extended or adjusted under 35 U.S.C. 154(b) by 163 days.

(21) Appl. No.: 11/813,065

(22) PCT Filed: Dec. 27, 2005

(86) PCT No.: PCT/JP2005/023845
§ 371 (c)(1),
(2), (4) Date: Jun. 28, 2007

(87) PCT Pub. No.: WO2006/070773
PCT Pub. Date: Jul. 6, 2006

(65) Prior Publication Data
US 2007/0285148 A1    Dec. 13, 2007

(30) Foreign Application Priority Data
Dec. 28, 2004 (JP) .................... 2004-378701

(51) Int. Cl.
*H01L 29/04* (2006.01)
(52) U.S. Cl. .............. 257/3; 257/2; 257/E45.003
(58) Field of Classification Search ............ 257/2, 3, 257/E45.003
See application file for complete search history.

(56) References Cited

U.S. PATENT DOCUMENTS

| 5,761,115 A | * | 6/1998 | Kozicki et al. ............ 365/182 |
| 6,487,106 B1 | * | 11/2002 | Kozicki ................ 365/153 |
| 7,116,573 B2 | * | 10/2006 | Sakamoto et al. ............ 365/153 |
| 2004/0178402 A1 | * | 9/2004 | Ovshinsky et al. ............ 257/2 |
| 2004/0235204 A1 | * | 11/2004 | Kozicki ................ 438/9 |

FOREIGN PATENT DOCUMENTS

| JP | 2000-512058 A | 9/2000 |
| JP | 2002-536840 A | 10/2002 |
| JP | 2003-92387 A | 3/2003 |
| JP | 2006-173267 A | 6/2006 |

OTHER PUBLICATIONS

Office Action, Issued Apr. 3, 2012 by the Japanese Patent Office in counterpart Japanese Application No. 2006-550776.

* cited by examiner

*Primary Examiner* — Kiesha Bryant
*Assistant Examiner* — Jamie C Niesz
(74) *Attorney, Agent, or Firm* — Sughrue Mion, PLLC

(57) ABSTRACT

The switching element of the present invention is of a configuration that includes: an ion conduction layer (40) that includes an oxide, a first electrode (21) and a second electrode (31) that are provided in contact with the ion conduction layer (40) and that are connected by the precipitate of metal that is supplied from the outside or for which electrical properties change due to the dissolution of precipitated metal, and a third electrode (35) provided in contact with the ion conduction layer (40) and that can supply metal ions. The use of this configuration allows the switching voltage to be set higher than in the related art.

26 Claims, 6 Drawing Sheets

SWITCHING ELEMENT, RECONFIGURABLE LOGIC INTEGRATED CIRCUIT AND MEMORY ELEMENT

TECHNICAL FIELD

The present invention relates to a switching element that uses an electrochemical reaction, to a reconfigurable logic integrated circuit, and to a memory element.

BACKGROUND ART

LSI for specific purposes (Application Specific Integrated Circuits: ASIC) are provided with a plurality of logic cells that serve as basic logic circuits, the logic cells that are to be put into operation being selected to match a user's specifications. ASIC include conventional ASIC in which the logic cells are determined in an interconnect patterning step in the fabrication process and programmable logic (reconfigurable logic integrated circuits) in which the logic cells are determined by the user after shipment of the product. Although conventional ASIC has the merit of cheap product unit cost realized by mass production, it suffers from the demerits of high development cost and lengthy development time. On the other hand, although programmable logic has higher product unit price, slower operating speed, and increased power consumption than conventional ASIC, it enjoys the advantages of lower development cost and shorter development time. Development is currently underway to both improve the operational performance and reduce the size of switching elements for programming for the purposes of achieving programmable logic having lower product unit cost, faster operating speed, and lower power consumption.

The application of the programmable device disclosed in JP-A-2002-536840 (hereinbelow referred to as Patent Document 1) for the switching elements of programmable logic can be considered. The following simplified explanation regards the configuration for a case in which the two-terminal switch of this programmable device is applied to a switching element.

The programmable device disclosed in Patent Document 1 is made up from a multiplicity of logic cells arranged in the form of a two-dimensional array, interconnects for interconnecting logic cells, and a multiplicity of two-terminal switches for switching between connection and non-connection between interconnects. Switching the connection states (connection/non-connection) of the two-terminal switches sets the configuration of the interconnects between logic cells and the functions of the logic cells and thus can realize a logic integrated circuit that matches certain specifications.

DISCLOSURE OF THE INVENTION

In the above-described two-terminal switch, a combination of Cu/Cu$_2$S, Ag/Ag$_2$S and Ag/AgGeSe may be employed as the "electrode material/fixed electrolyte (ionic conduction) material." In any of the combinations of materials, the switching voltage for causing the two-terminal switch to transition from the ON state to the OFF state or from the OFF state to the ON state is on the order of from 0.05 V to 0.3 V. On the other hand, the logic signals that are applied as input to the two-terminal switch normally indicate one of two types of information: the voltage Vdd, which is the operating voltage of the logic circuit, indicating one type of information and the voltage 0 V indicating the other type of information. Vdd that is currently used in silicon integrated circuits is on the order of from 1 to 2 V.

If the switching voltage is no higher than 0.3 V while the logic signal Vdd is 1.0 V as described above, the switching voltage is lower than Vdd. As a result, each time a logic signal of voltage Vdd is applied as input to the two-terminal switch, a voltage of 1.0 V is applied to the electrode, raising the concern that the state of the two-terminal switch will change under the influence of the logic signal itself. In such a case, the problem occurs that the two-terminal switch will not function as a switch. The switching voltage must be made higher to attain greater stability of the switching element.

In addition, the time over which the state of the switching elements is maintained (the time over which non-volatility is maintained) must be a time period longer than the product life of the programmable logic (typically ten years). In the case of an absolute temperature of 300 K, the thermal energy is approximately 26 meV, whereby the potential for spontaneous transition between states as a result of thermal noise increases as the switching voltage approaches 26 mV. The switching voltage must be raised to increase the time over which states are maintained.

The present invention was realized for the purpose of solving the above-described problems of the related art and has as its object the provision of a switching element in which the switching voltage is set higher than in the related art and a reconfigurable logic integrated circuit and a memory element that use the switching element.

The switching element of the present invention for achieving the above-described object is of a configuration including: an ion conduction layer that contains an oxide; a first electrode and a second electrode provided in contact with the ion conduction layer, that are connected by a metal precipitate supplied from the outside or for which electrical properties are changed by the dissolution of metal that has precipitated; and a third electrode provided in contact with the ion conduction layer and that can supply metal ions.

The present invention allows any switching voltage to be set by selecting, as the ion conduction layer, from a plurality of varieties for chalcogen elements compounds, and the use of an ion conduction layer that contains a material such as an oxide in which the mobility of metal ions is low increases the switching voltage. Setting the switching voltage to a higher value than the voltage of the noise level that is applied as input to the electrodes of the switching elements can prevent the switching element from transitioning from the set state to another state.

EXPLANATION OF REFERENCE NUMBERS

| | |
|---|---|
| 12, 21, 23, 26 | first electrode |
| 14, 31, 32, 33 | second electrode |
| 34, 35, 37 | third electrode |
| 40, 44, 45 | ion conduction layer |

BEST MODE FOR CARRYING OUT THE INVENTION

Figure 1:
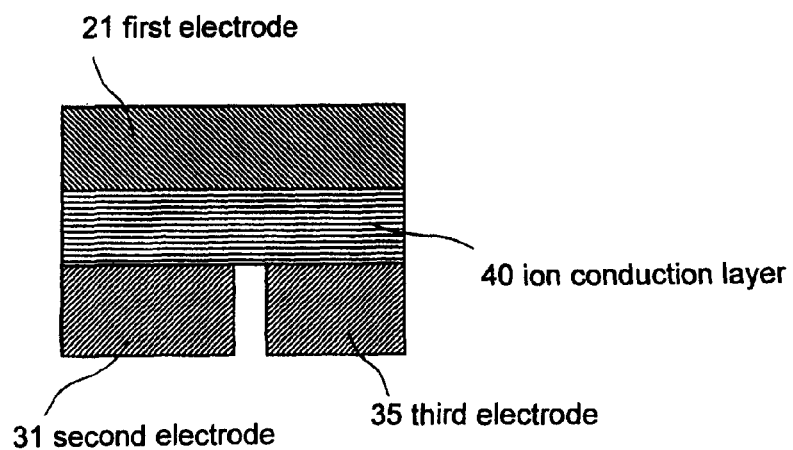
FIG. 1 is a schematic sectional view showing an example of the configuration of a basic three-terminal switch.

Explanation next regards the basic configuration of a three-terminal switch relating to the present invention. FIG. 1 is a schematic sectional view showing an example of the configuration of a three-terminal switch.

As shown in FIG. 1, the three-terminal switch is of a configuration that includes: first electrode 21; and second electrode 31 and third electrode 35 provided such that ion conduction layer 40 is interposed between first electrode 21 and second and third electrodes 34 and 35. First electrode 21 and second electrode 31 are formed from platinum, and third electrode 35 is formed from copper. Ion conduction layer 40 is a medium for conducting metal ions. In this case, ion conduction layer 40 is formed from copper sulfide. The distance between second electrode 31 and third electrode 35 is 0.2 μm, and second electrode 31 and third electrode 35 are therefore arranged separated by this distance.

Explanation next regards the operation of the three-terminal switch shown in FIG. 1.

When second electrode 31 and third electrode 35 are grounded and a negative voltage is applied to first electrode 21, the copper of third electrode 35 becomes copper ions and dissolves in ion conduction layer 40. The copper ions in ion conduction layer 40 then become copper and precipitate on the surfaces of first electrode 21 and second electrode 31, whereby the precipitated copper forms a metal dendrite that connects first electrode 21 and second electrode 31. The metal dendrite is the metal precipitate of metal ions that have precipitated in ion conduction layer 40. First electrode 21 and second electrode 31 are electrically connected by the metal dendrite, and the three-terminal switch therefore enters the ON state.

On the other hand, when the second electrode 31 in the above-described ON state is grounded and a negative voltage is applied to third electrode 35, the copper of the metal dendrite dissolves in ion conduction layer 40, whereby a portion of the metal dendrite is cut. The electrical connection between first electrode 21 and second electrode 31 is thereby cut, and the three-terminal switch enters the OFF state. In addition, from the stage preceding complete disconnection of the electrical connection, the electrical properties undergo various changes such as increase in the resistance between first electrode 21 and second electrode 31 or changes in the capacitance between electrodes, following which the electrical connection is finally cut.

To set to the ON state from the above-described OFF state, a positive voltage should be applied to third electrode 35, whereby the copper of the third electrode 35 becomes copper ions and dissolves in ion conduction layer 40. The copper ions that have dissolved in ion conduction layer 40 become copper and precipitate at the site at which the metal dendrite was cut, whereby the metal dendrite electrically connects first electrode 21 and second electrode 31.

When transitioning from the above-described OFF state to the ON state, three reactions are carried out simultaneously. These three reactions are: (1) the movement of metal ions in ion conduction layer 40, (2) the precipitation reaction of metal ions at first electrode 21, and (3) the dissolution reaction of metal at third electrode 35. The inventors of the present invention arrived at the idea of setting the applied voltage necessary for changing from the OFF state to the ON state to any value by controlling each of: the speed of movement of metal ions, the speed of precipitation of metal, and the speed of the dissolution of metal. The speed of movement of metal ions can be controlled by the material of the ion conduction layer, the type of metal ions, and the ambient temperature.

The switching element of the present invention is a device in which the switching voltage, which is the voltage applied for transitioning from the OFF state to the ON state, is set to any value by appropriately selecting the material of the ion conduction layer and the type of metal ions in the three-terminal switch shown in FIG. 1.

A chalcogenide, which is a compound that contains a chalcogen element, or a halogenide, which is a compound that contains a halogen element, can be applied as the material that is contained in ion conduction layer. Chalcogen elements include oxygen, sulfur, selenium, tellurium, and polonium. Halogen elements include fluorine, chlorine, bromine, iodine, and astatine. Chalcogenides and halogenides include materials in which the ionic conductivity of metal ions is high (such as copper sulfide, silver sulfide, silver telluride, rubidium copper chloride, silver iodide and copper iodide), and materials in which the ionic conductivity is low (such as tantalum oxide, silicon oxide, tungsten oxide, and alumina).

When the mobility of metal ions is changed by the ambient temperature, FIG. 14 of a reference (Journal of Applied Physics, Vol. 56, No. 2, pp. 327-335) discloses that the mobility of copper ions in an ion conduction layer decreases exponentially as the temperature decreases. Explanation next regards experiments that were conducted to investigate changes in the mobility of metal ions due to changes in temperature. The configuration and operation of the two-terminal switch used in the experiments are first briefly described.

Figure 2:
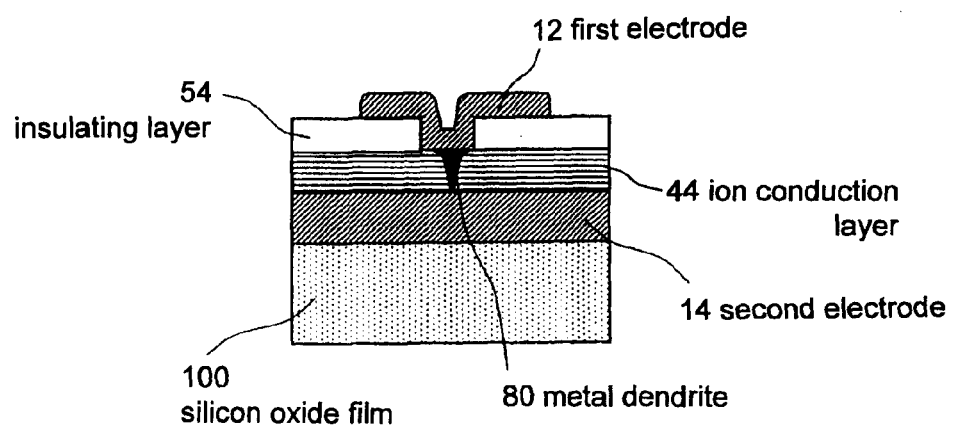
FIG. 2 is a schematic sectional view showing the configuration of a two-terminal switch that is used in experimentation.

FIG. 2 is a schematic sectional view showing the configuration of the two-terminal switch used in the experiments. As shown in FIG. 2, the two-terminal switch includes: second electrode 14 composed of copper provided on silicon oxide film 100 that is formed on the surface of a silicon substrate; ion conduction layer 44 composed of copper sulfide provided on second electrode 14; insulating layer 54 composed of a calixarene provided on ion conduction layer 44, and first electrode 12 composed of platinum provided on insulating layer 54. An aperture having a diameter of 0.2 μm is formed in insulating layer 54, and first electrode 12 contacts ion conduction layer 44 through this aperture. In addition, as shown in FIG. 2, metal dendrite 80 is formed in ion conduction layer 44 from first electrode 12 at the position of the aperture of insulating layer 54.

If metal dendrite 80 electrically connects first electrode 12 and second electrode 14, the two-terminal switch enters the ON state, but if a portion of metal dendrite 80 is cut, the two-terminal switch enters the OFF state. When a negative voltage is applied to first electrode 12 from this OFF state, second electrode 14 supplies copper ions to ion conduction layer 44. The copper ions from ion conduction layer 44 become copper and precipitate at the portion of metal dendrite 80 that was electrically cut. Metal dendrite 80 then electrically connects first electrode 12 and second electrode 14, whereby the two-terminal switch transitions from the OFF state to the ON state.

Explanation next regards the results of measuring the temperature characteristics of the two-terminal switch shown in FIG. 2.

Figure 3:
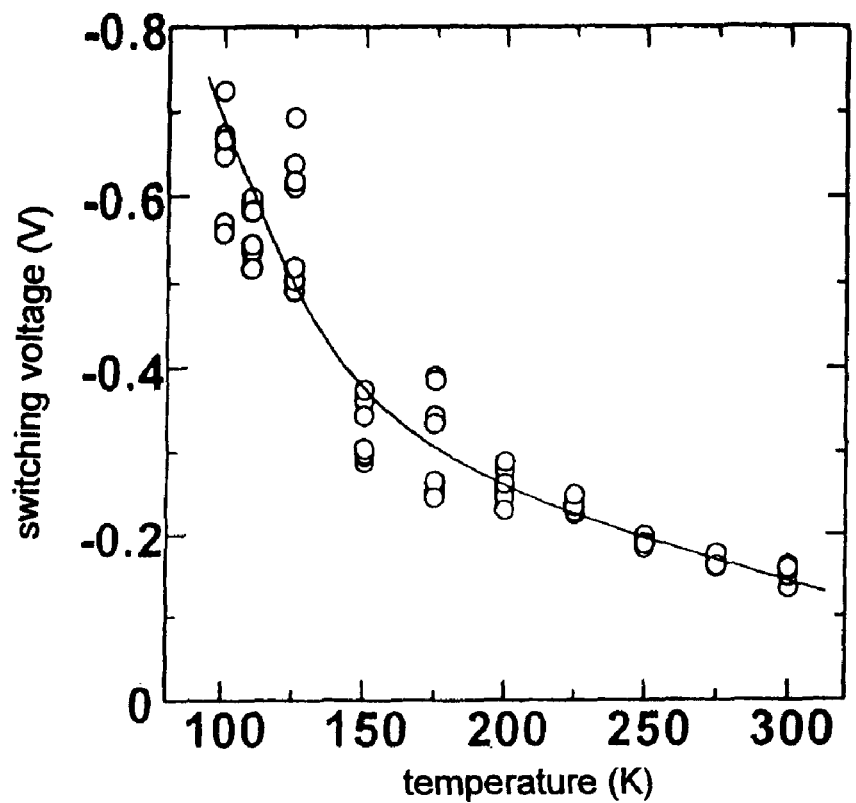
FIG. 3 is a graph showing the dependency of the switching voltage upon temperature.

FIG. 3 is a graph showing the dependency of the switching voltage upon temperature. In this case, the switching voltage is assumed to be the voltage applied to first electrode 12 for causing the transition of the two-terminal switch from the OFF state to the ON state. The vertical axis shows the switching voltage, and the horizontal axis shows the absolute temperature.

As shown in FIG. 3, the switching voltage is no greater than 0.2 V at room temperature (300 K) but rises to 0.6 V at an absolute temperature of 100 K. Further, although not shown in the graph of FIG. 3, the switching voltage rises as high as 1 V at an absolute temperature of 5 K. Based on the results shown in FIG. 3, it can be seen that the switching voltage increases as the temperature decreases. These experimental data show that the switching voltage can be controlled by changing the speed of movement of metal ions.

Explanation next regards the switching characteristics for this two-terminal switch when the material of the ion conduction layer is varied. In this case, the switching characteristics are compared for a case in which ion conduction layer 44 is copper sulfide and a case in which ion conduction layer 44 is of tantalum oxide, which has lower metal ion mobility for copper than copper sulfide.

Figure 4A:
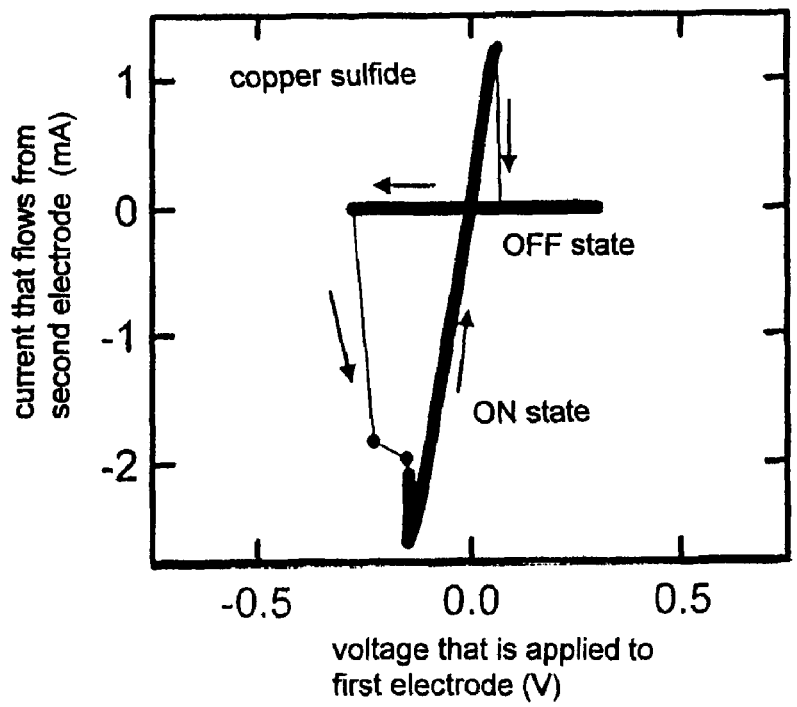
FIG. 4A is a graph showing switching characteristics.
Figure 4B:
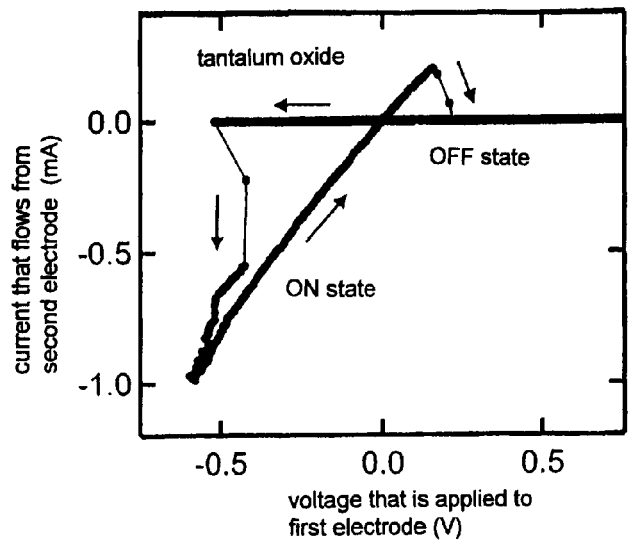
FIG. 4B is a graph showing switching characteristics.

FIG. 4A is a graph showing the switching characteristics when the ion conduction layer is of copper sulfide, and FIG. 4B is a graph showing switching characteristics when the ion conduction layer is of tantalum oxide. The vertical axis shows the current that flows from second electrode 14 to first electrode 12, and the horizontal axis shows the voltage that is applied to first electrode 12.

As shown in FIG. 4A, the switching voltage is 0.28 V when ion conduction layer 44 is of copper sulfide. In contrast, the switching voltage is −0.5 V when ion conduction layer 44 is of tantalum oxide. This increase in the switching voltage arises because the speed of movement of copper ions is lower in tantalum oxide than in copper sulfide. It can therefore be seen that changing the ion conduction layer from copper sulfide to tantalum oxide increases the switching voltage by approximately twofold. An investigation of the switching characteristics of various ion conduction layers as shown in the graphs of FIG. 4A and FIG. 4B shows that the material of the ion conduction layer can be determined to obtain a desired switching voltage.

First Working Example

Figure 5:
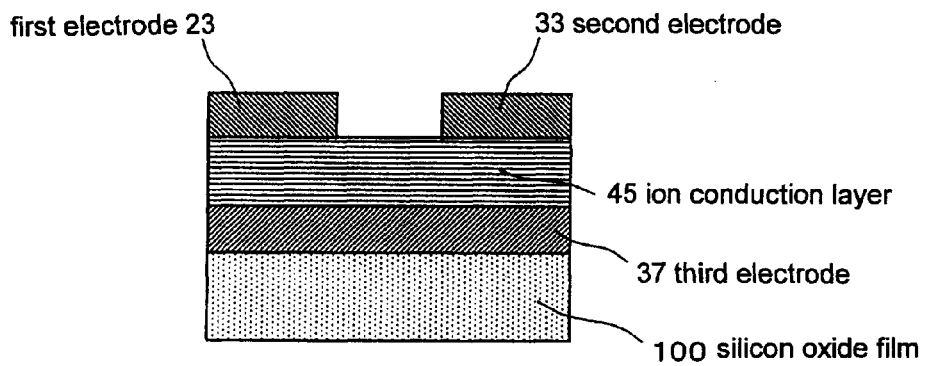
FIG. 5 is a schematic sectional view showing an example of the configuration of the three-terminal switch of the first working example.

Explanation next regards the configuration of the present working example. FIG. 5 is a schematic sectional view showing an example of the configuration of the three-terminal switch of the present working example.

As shown in FIG. 5, the three-terminal switch includes: first electrode 23 and second electrode 33 that are electrically connected and electrically cut; and third electrode 37 provided such that ion conduction layer 45 is interposed between third electrode 37 and first and second electrodes 23 and 33. Third electrode 37 is provided on silicon oxide film 100 that has been formed on the surface of a silicon substrate, this third electrode 37 being formed of copper. Ion conduction layer 45 is provided on third electrode 37 and is formed of tantalum oxide. First electrode 23 and second electrode 33 are formed on the same plane on ion conduction layer 45, these two electrodes being separated by a distance on the order of from 10 nm to 100 nm. First electrode 23 and second electrode 33 are formed of platinum.

Explanation next regards the operation of the three-terminal switch shown in FIG. 5.

When first electrode 23 and second electrode 33 are grounded and a positive voltage is applied to third electrode 37, copper of the third electrode 37 become copper ions and dissolves into ion conduction layer 45. The copper ions that have dissolved into ion conduction layer 45 then become copper and precipitate on the surfaces of first electrode 23 and second electrode 33, and a metal dendrite that connects first electrode 23 and second electrode 33 is formed by the precipitated copper. The electrical connection between first electrode 23 and second electrode 33 realized by the metal dendrite causes the three-terminal switch to enter the ON state.

On the other hand, when a voltage of −0.5 V is applied to third electrode 37 in the above-described ON state, the copper of the metal dendrite dissolves into ion conduction layer 45 and cuts a portion of the metal dendrite, whereby the electrical connection between first electrode 23 and second electrode 33 is cut and the three-terminal switch enters the OFF state.

To change from the above-described OFF state to the ON state, a positive voltage on the order of 0.5 V is applied to third electrode 37, whereby the copper of third electrode 37 becomes copper ions that dissolve into ion conduction layer 45. The copper ions that have dissolved into ion conduction layer 45 then become copper and precipitate at the point of the metal dendrite that was cut, and the metal dendrite thus electrically connects first electrode 23 and second electrode 33.

Explanation next regards the method of fabricating the three-terminal switch shown in FIG. 5.

Silicon oxide film 100 having a film thickness of 300 nm is formed on the surface of a silicon substrate. A resist pattern is formed at points at which third electrode 37 is not to be formed using a conventional lithographic technique. Copper is next formed to a film thickness of 100 nm over this pattern by a vacuum evaporation method, following which the resist pattern is lifted off by a lift-off technique to form third electrode 37 from the remaining copper.

Tantalum oxide, which is to serve as ion conduction layer 45, is next formed to a film thickness of 10 nm by a laser ablation method or sputtering method to cover the upper surface and side surfaces of third electrode 37. Resist pattern formation, vacuum evaporation, and lift-off are next carried out successively to form platinum, which is to serve as first electrode 23 and second electrode 33, to a film thickness of 40 nm on ion conduction layer 45. At this time, the distance between first electrode 23 and second electrode 33 is set by the dimensions of the resist pattern realized by lithographic techniques, and as described hereinabove, is on the order of from 10 nm to 100 nm.

Explanation next regards the method of forming the metal dendrite. When first electrode 23 and second electrode 33 are grounded and a voltage of −0.5 V is applied to third electrode 37, a metal dendrite grows between first electrode 23 and second electrode 33. The metal dendrite electrically connects first electrode 23 and second electrode 33, whereby the three-terminal switch enters the ON state. Then, the application of a prescribed voltage to third electrode 37 as described hereinabove enables the transition of the three-terminal switch to either the OFF state or the ON state.

In the three-terminal switch of the present working example, the magnitude of the switching voltage necessary for the transition between the ON state and OFF state is on the order of 0.5 V, and compared to a case in which copper sulfide is used in the ion conduction layer, the switching voltage increases for case in which the oxide tantalum oxide is used. In this way, setting the switching voltage to a higher value than the noise level voltage that is applied as input to the electrode of a switching element enables the prevention of transitions of the switching element to states other than the set state.

The oxide used in the ion conduction layer is not limited to tantalum oxide, and similar effects are obtained for any of tungsten oxide, molybdenum oxide, titanium oxide, aluminum oxide, and silicon oxide.

Second Working Example

The present working example is of a configuration that employs the same material in the second electrode as in the third electrode in the three-terminal element shown in FIG. 5.

Figure 6:
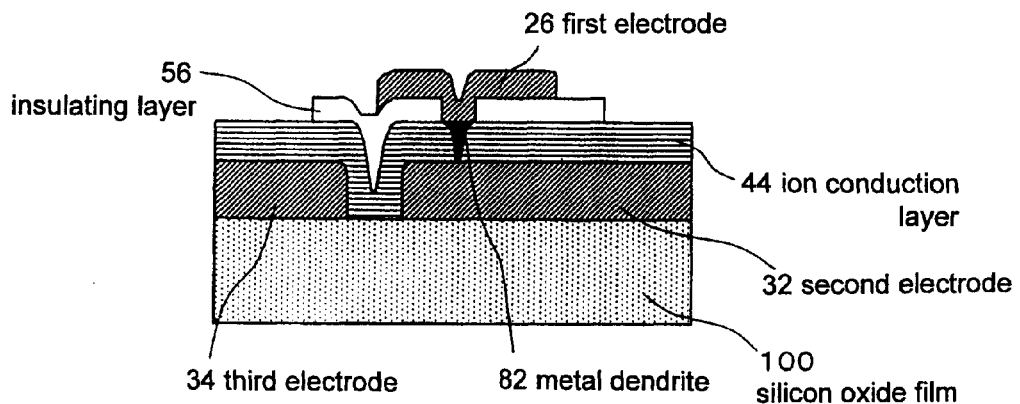
FIG. 6 is a schematic sectional view showing an example of the configuration of the three-terminal switch of the second working example.

Explanation next regards the configuration of the three-terminal switch of the present working example. FIG. 6 is a schematic sectional view showing an example of the configuration of the three-terminal switch of the present working example.

As shown in FIG. 6, the three-terminal switch is provided with second electrode 32 and third electrode 34 composed of copper on silicon oxide film 100 that has been formed on the surface of a silicon substrate. Second electrode 32 and third electrode 34 are separated by a distance of from 50 nm to 1 μm. Ion conduction layer 44 composed of tantalum oxide is provided to cover the top surfaces and side surfaces of second electrode 32 and third electrode 34. Insulating layer 56 that includes an aperture with a diameter of 0.2 μm is formed on ion conduction layer 44. Insulating layer 56 is formed of a calixarene. The aperture is formed at a position that confronts second electrode 32 with ion conduction layer 44 interposed. First electrode 26 composed of platinum is formed over insulating layer 56. First electrode 26 contacts ion conduction layer 44 by way of the aperture of insulating layer 56. In addition, as shown in FIG. 6, in the present working example, metal dendrite 82 is formed in ion conduction layer 44 from first electrode 26 at the position of the aperture of insulating layer 56.

Explanation next regards the operation of the three-terminal switch shown in FIG. 6.

In the state preceding the application of voltage, first electrode 26 and second electrode 32 are electrically connected by way of a metal dendrite of copper, and the initial state of the three-terminal switch is therefore the ON state. To turn OFF the three-terminal switch, a voltage of approximately −0.5 V is applied to third electrode 34 relative to first electrode 26 and second electrode 32 in which the potential has been equalized. The negative voltage of third electrode 34 causes the copper of the metal dendrite to become copper ions and dissolve in ion conduction layer 44, whereupon the dissolved copper ions become copper and precipitate on the surface of the third electrode. As a result, a portion of the metal dendrite is electrically cut and the three-terminal switch transitions to the OFF state.

On the other hand, when the three-terminal switch is in the OFF state and a voltage of approximately 0.5 V is applied to third electrode 34, third electrode 34 supplies copper ions to ion conduction layer 44. In addition, the copper ions that have dissolved in ion conduction layer 44 become copper and precipitate at the portion of metal dendrite 82 that was electrically cut, whereupon metal dendrite 82 connects first electrode 26 and second electrode 32 and the three-terminal switch transitions to the ON state.

Explanation next regards the method of fabricating the three-terminal switch shown in FIG. 6.

Silicon oxide film 100 is formed to a film thickness of 300 nm on the surface of a silicon substrate. A resist pattern is formed by a conventional lithographic technique at points on silicon oxide film 100 at which second electrode 32 and third electrode 34 are not to be formed. Then, after forming copper to a film thickness of 100 nm over the resist pattern by a vacuum evaporation method, the resist pattern is lifted off by a lift-off technique to form second electrode 32 and third electrode 34 from the remaining portions of copper. At this time, the distance between second electrode 32 and third electrode 34 is set to the above-described value from 50 nm to 1 μm by the dimensions of the resist pattern realized by a lithographic technique.

Tantalum oxide that is to serve as ion conduction layer 44 is next formed to a film thickness of 10 nm by a laser ablation method or a sputtering method to cover the top surfaces and side surfaces of second electrode 32 and third electrode 34. A calixarene that is to serve as insulating layer 56 is then applied to a film thickness of 120 nm by a spin coat, and a pattern having an aperture with a diameter of 0.2 μm is formed in insulating layer 56 by a lithographic method. At this time, the aperture is formed at a point of insulating layer 56 located over second electrode 32. Resist pattern formation, vacuum evaporation of platinum, and lift-off are then carried out successively to form first electrode 26 of platinum for which the planar pattern is smaller than the pattern of insulating layer 56.

Explanation next regards the method of forming the metal dendrite. Second electrode 32 and third electrode 34 are grounded and a voltage of approximately −0.5 V is applied to first electrode 26. The application of a negative voltage of 0.5 V to first electrode 26 causes metal dendrite 82 of copper to grow from the surface of first electrode 26 at the point of the aperture of insulating layer 56 and toward second electrode 32, whereby the two electrodes are electrically connected. As described above, the application of a prescribed voltage to third electrode 34 can cause the three-terminal switch to transition to either the OFF state or ON state.

The three-terminal switch of the present working example obtains not only the same effects as the first working example, but also has the feature of forming a metal dendrite before the disconnection/connection of the metal dendrite realized by the application of voltage to the third electrode. Applying voltage to the third electrode to form a metal dendrite between the first electrode and second electrode without having formed the metal dendrite beforehand raises the potential problem of connections between the third electrode and the first electrode and between the third electrode and second electrode. The configuration of the present working example can circumvent this problem. In addition, the provision of insulating layer 56 minimizes the area over which first electrode 26 contacts ion conduction layer 44 and thus can reduce the leak current between first electrode 26 and second electrode 32 when the three-terminal switch is in the OFF state, thereby achieving a greater reduction of the current consumption of the three-terminal switch. This insulating layer can also be applied in the first working example.

Third Working Example

The present working example is a device that employs stacked ion conduction layers in which a plurality of ion conduction layers having different ionic conductivity are stacked. Stacked ion conduction layers can also be applied in either of the first and second working examples, but explanation here regards application to the first working example. Components that are identical to the first working example are given the same reference numbers, and detailed explanation of these components is here omitted.

Figure 7:
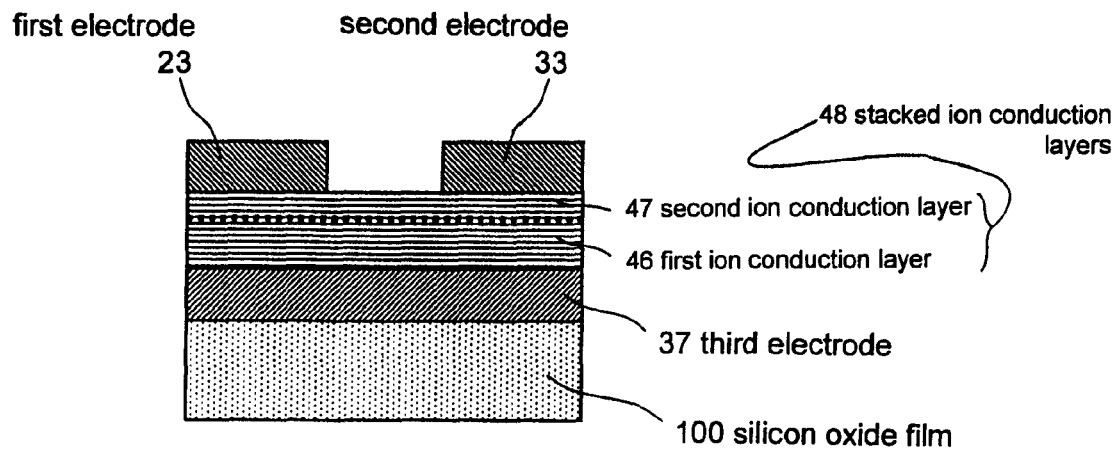
FIG. 7 is a schematic sectional view showing an example of the configuration of the three-terminal switch of the third working example.

Explanation next regards the three-terminal switch of this working example. FIG. 7 is a schematic sectional view showing an example of the configuration of the three-terminal switch of the present working example.

As shown in FIG. 7, the three-terminal switch uses stacked ion conduction layers 48 in the ion conduction layer of the three-terminal switch described in the first working example. Stacked ion conduction layers 48 of the present working example are a configuration in which two layers, first ion conduction layer 46 and second ion conduction layer 47, are stacked. First ion conduction layer 46, which is the lower layer, is formed from copper sulfide with a film thickness of 40 nm. Second ion conduction layer 47, which is the upper layer, is formed of tantalum oxide having a film thickness of 5 nm. As to the method of forming stacked ion conduction layers 48, when forming the ion conduction layer described in the first working example, copper sulfide that will serve as first ion conduction layer 46 and tantalum oxide that will serve as second ion conduction layer 47 may be successively formed by a laser ablation method on third electrode 37.

In the three-terminal switch of the present working example, the use of stacked ion conduction layers 48 in which two layers, copper sulfide having a film thickness of 40 nm and tantalum oxide having a film thickness of 5 nm, are stacked enables a switching voltage having a value between −0.28 V and −0.5 V. Any value between −0.28 V and −0.5 V can be obtained for the switching voltage by changing the ratio of the film thicknesses of first ion conduction layer 46 and second ion conduction layer 47. In the present working example, first ion conduction layer 46 has a larger film thickness ratio than second ion conduction layer 47, and the switching voltage realized by stacked ion conduction layers 48 therefore has a value closer to switching voltage (−0.28 V) of first ion conduction layer 46 than the average value of the two switching voltages ((−0.28 V−0.5V)×½). The stacked ion conduction layers are not limited to two layers and may also be three or more layers.

Explanation next regards another example of the configuration of three-terminal switch of the present working example. FIGS. 8A to 8D are schematic sectional views showing other examples of the configuration of the three-terminal switch of the present working example.

Figure 8A:
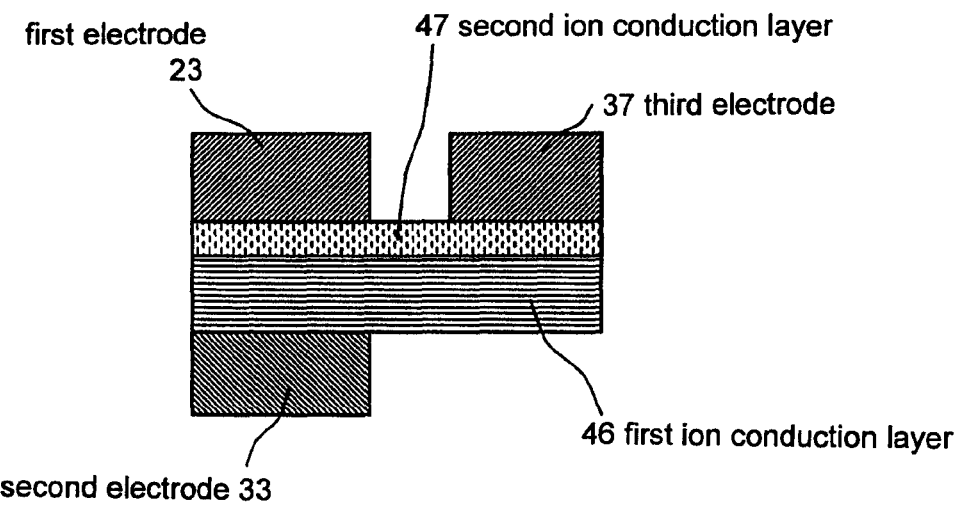
FIG. 8A is a schematic sectional view showing another example of the configuration of the three-terminal switch of the third working example.

The three-terminal switch shown in FIG. 8A is provided with first electrode 23 and third electrode 37 on stacked ion conduction layers in which first ion conduction layer 46 and second ion conduction layer 47 have been successively stacked, and further, is provided with second electrode 33 under first ion conduction layer 46. First electrode 23 and second electrode 33 are arranged to confront each other across the stacked ion conduction layers. In the configuration shown in FIG. 8A, metal ions are efficiently supplied from third electrode 37 to between first electrode 23 and second electrode 33 by way of first ion conduction layer 46, and the voltage required for transitions is therefore chiefly determined not by the distance between first electrode 23 and third electrode 37 but by the film thickness of second ion conduction layer 47, which is an ion conductor having a low level of mobility due to factors that will be explained hereinbelow. The present configuration therefore increases the degree of freedom of design regarding the film thickness of first ion conduction layer 46 and the position of third electrode 37 on first ion conduction layer 46.

Figure 8B:
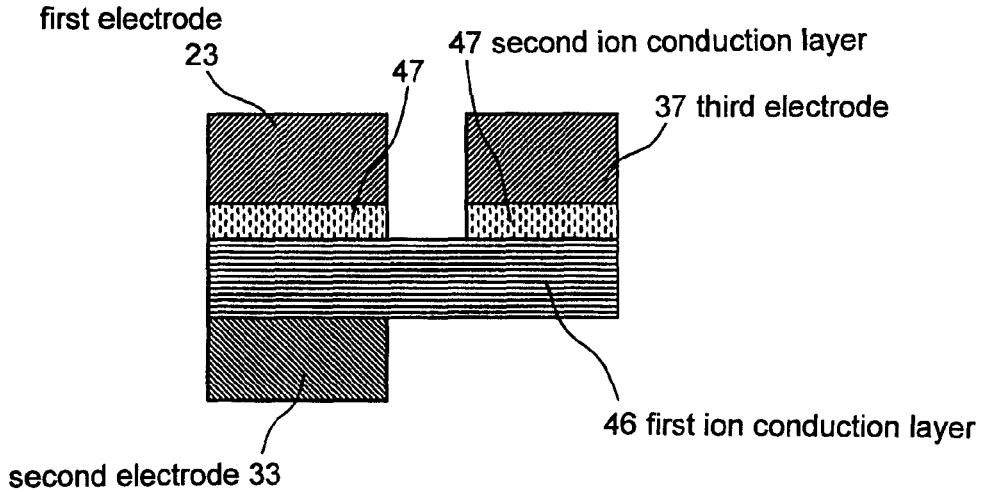
FIG. 8B is a schematic sectional view showing another example of the configuration of the three-terminal switch of the third working example.

The three-terminal switch shown in FIG. 8B is of a configuration in which second ion conduction layer 47 is removed in the region that is interposed between first electrode 23 and third electrode 37 in the three-terminal switch shown in FIG. 8A. In the configuration shown in FIG. 8B, metal ions can be efficiently supplied from third electrode 37 to between first electrode 23 and second electrode 33 by way of first ion conduction layer 46, as in the configuration shown in FIG. 8A.

Figure 8C:
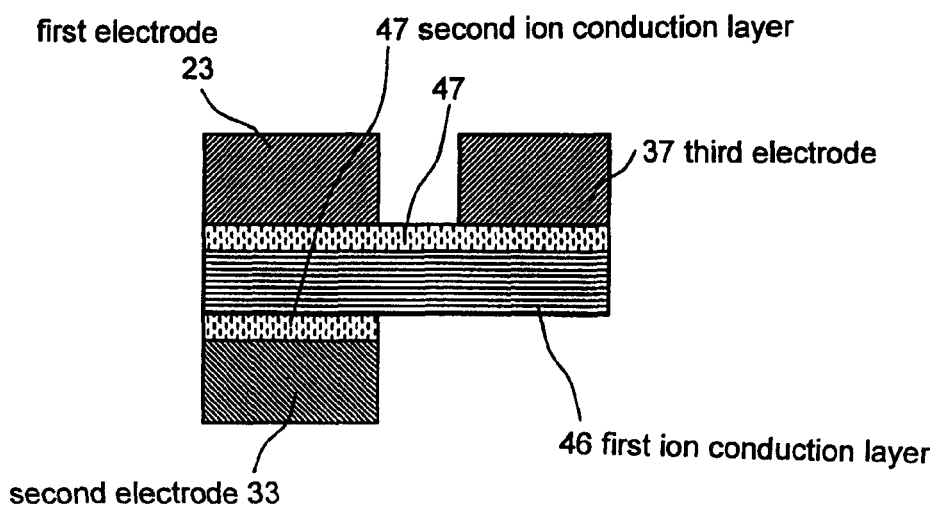
FIG. 8C is a schematic sectional view showing another example of the configuration of the three-terminal switch of the third working example.

The three-terminal switch shown in FIG. 8C is of a configuration in which second ion conduction layer 47 is also provided between first ion conduction layer 46 and second electrode 33 in the three-terminal switch shown in FIG. 8A. First electrode 23 and second electrode 33 are arranged to confront each other across a stacked ion conduction layer that is composed of the three layers: second ion conduction layer 47/first ion conduction layer 46/second ion conduction layer 47. In the configuration shown in FIG. 8C, metal precipitates to electrically connect first electrode 23 and second electrode 33, following which the precipitation and dissolution of metal when switching between ON and OFF can be caused to occur in first ion conduction layer 46. This result is obtained because first ion conduction layer 46 is an ion conductor having higher mobility than second ion conduction layer 47.

Figure 8D:
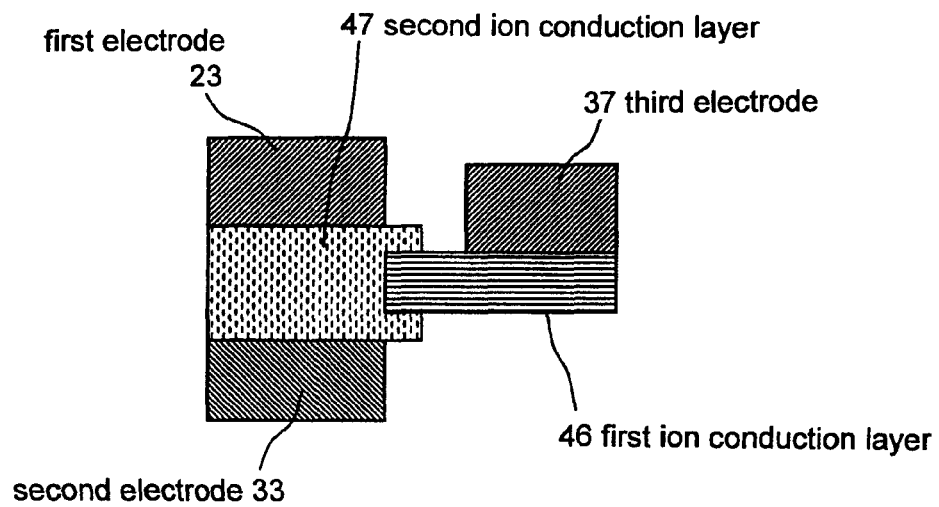
FIG. 8D is a schematic sectional view showing another example of the configuration of the three-terminal switch of the third working example.

The three-terminal switch shown in FIG. 8D is a device in which first electrode 23 and second electrode 33 are arranged to confront each other across second ion conduction layer 47, and third electrode 37 is provided on first ion conduction layer 46 that is formed notched into a portion of the side surface of second ion conduction layer 47. In the configuration shown in FIG. 8D, as in the configuration shown in FIG. 8A, metal ions are efficiently supplied by way of first ion conduction layer 46 from third electrode 37 to between first electrode 23 and second electrode 33, whereby the voltage required for transitions is chiefly determined not by the distance between first electrode 23 and third electrode 37, but by the film thickness of second ion conduction layer 47, which is an ion conductor having lower mobility for reasons that will be described hereinbelow. As a result, the present configuration increases the degree of freedom of design relating to the film thickness of first ion conduction layer 46 that is provided at the side surface of second ion conduction layer 47, and further, relating to the position of third electrode 37 on first ion conduction layer 46.

Explanation next regards the materials of each component of the three-terminal switch shown in FIGS. 8A to 8D. Third electrode 37 is composed of a metal that can supply metal ions to an ion conduction layer. First electrode 23 is composed of a metal that does not supply metal ions to an ion conduction layer. In contrast, the material of second electrode 33 may be either a metal that can supply metal ions or a metal that cannot supply metal ions. When second electrode 33 is a metal material that can supply metal ions, a method of operation similar to that described in the second working example is employed in the three-terminal switch of the present working example.

When second electrode 33 is a metal material that does not supply metal ions, a method of operation similar to that described in the first working example is employed in the three-terminal switch of the present working example.

In addition, copper and silver are suitable as metals that can supply metal ions to an ion conduction layer. Platinum, titanium nitride, and silicide are suitable as metals that do not supply metal ions to an ion conduction layer. Copper sulfide, which is an ion conductor having a high level of metal ion mobility, is suitable as first ion conduction layer 46; and tantalum oxide, which is an ion conductor having low mobility, is suitable as second ion conduction layer 47.

As described in each of the first and second working examples, transitions between the electrical ON/OFF state between first electrode 23 and second electrode 33 in the present working example can be realized by applying a positive or negative voltage to third electrode 37. As previously described, the voltage required for a transition is determined chiefly by the film thickness of second ion conduction layer 47, which is an ion conductor having low mobility, and the voltage required for a transition is therefore not strongly dependent on the spacing between first electrode 23 and third electrode 37. As the reason for this decreased dependence on distance, first ion conduction layer 46 that is an ion conductor having high mobility and that is between first electrode 23 and third electrode 37 has little effect upon the voltage required for transitions.

The method of fabricating the three-terminal switch of the present working example is next described. The film thickness of each ion conduction layer can be controlled by using a conventional semiconductor fabrication method such as a sputtering method to realize control on the nanometric order. Forming the film thickness of each ion conduction layer on the nanometric order enables accurate control of the voltage required for transition. On the other hand, taking into consideration the standards of lithographic techniques, the spacing between first electrode 23 and third electrode 37 must be on the order of at least 100 nm. The accuracy of conventional lithographic techniques is on the order of 10 nm, and as a result, even when the accuracy of the distance between first electrode 23 and third electrode 37 is no greater than 10 nm, an error of this magnitude has no effect on the voltage required for transitions in the configuration of the present working example. Thus, the three-terminal switch of the present working example can be easily manufactured even when conventional semiconductor fabrication methods are used.

As described hereinabove, the use of a plurality of types of ion conduction layers having different ionic conductivity in the three-terminal switch of the present working example increases the number of selection items for regulating the switching characteristics, these selection items including, for example, the type and film thickness of ion conductors and the arrangement of electrodes. Each of the selection items also enables finer control. As a result, the degree of freedom of the element configuration is augmented and the degree of design freedom is also increased. The present working example may also be applied to the two-terminal switch shown in FIG. 2.

Fourth Working Example

The present working example is a device in which the three-terminal switch of any of the first to third working examples is applied to a programmable logic switch.

Figure 9:
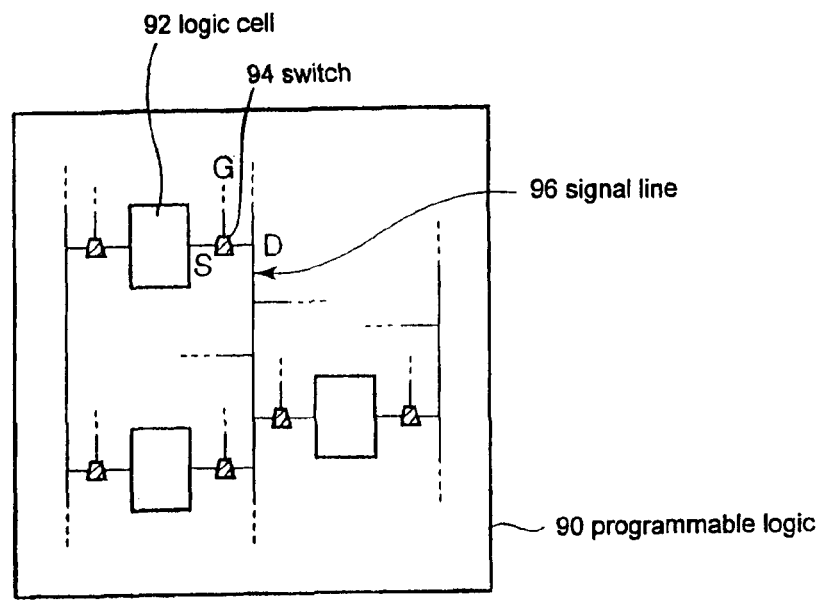
FIG. 9 is a schematic view showing an example of the configuration in which the three-terminal switch of the present invention is applied to programmable logic.

Explanation next regards the configuration of the programmable logic of the present working example. FIG. 9 is a schematic view showing an example of the configuration of programmable logic.

As shown in FIG. 9, programmable logic 90 is made up from a multiplicity of logic cells 92 arranged in a two-dimensional array form, interconnects for interconnecting the logic cells, and a multiplicity of switches 94 for switching between connection and non-connection between interconnects. Changing the connection state of the two-terminal switches (connection and non-connection) establishes the configuration of the interconnects between logic cells and the functions of the logic cells and allows a logic integrated circuit to be obtained that matches certain specifications.

Switch 94 is a transistor element composed of drain electrode D, source electrode S, and gate electrode G. By applying the three-terminal switch of the above-described working examples to the switches, the first electrode corresponds to drain electrode D, the second electrode corresponds to source electrode S, and the third electrode corresponds to gate electrode G. As shown in FIG. 9, source electrode S is connected to logic cell 92 and drain electrode D is connected to signal line 96 in programmable logic 90.

A three-terminal switch that has been set to the ON state maintains a state in which source electrode S is electrically connected to drain electrode D. When a logic signal arrives at drain electrode D by way of a signal line, the logic signal is applied as input to logic cell 92 by way of source electrode S. Conversely, a three-terminal switch that has been set to the OFF state maintains a state in which the electrical connection between source electrode S and drain electrode D is cut. In this case, a logic signal that arrives at drain electrode D by way of signal line 96 cannot enter logic cell 92 that is connected to source electrode S. In this way, programmable logic 90 allows a user to set the connection states between logic cells.

The use of the three-terminal switch of the present invention in a switch of programmable logic allows setting of the switching voltage of the switch to a desired value, and the switch therefore maintains the set state despite the input to the gate electrode of noise of a voltage that is lower than the switching voltage. The present invention therefore suppresses the transition to the ON state of logic cells that have not been set or the transition to the OFF state of logic cells that have been set, and programmable logic therefore operates with greater stability than the related art. In addition, the two-terminal switch shown in FIG. 2 may also be applied to a switch.

In the present working example, the switching element of the present invention is used for switching between connection and non-connection to logic cells, but the switching element of the present invention can also be applied to a switch for switching interconnects or switching the functions of logic cells. Examples of programmable logic in which the circuit configuration is altered by electronic signals and that can offer a variety of functions on a single chip include, for example, FPGA (Field-Programmable Gate Arrays) and DRP (Dynamically Reconfigurable Processors).

Fifth Working Example

The present working example is a case in which the three-terminal switch of any of the first to third working examples is applied to a memory element.

Figure 10:
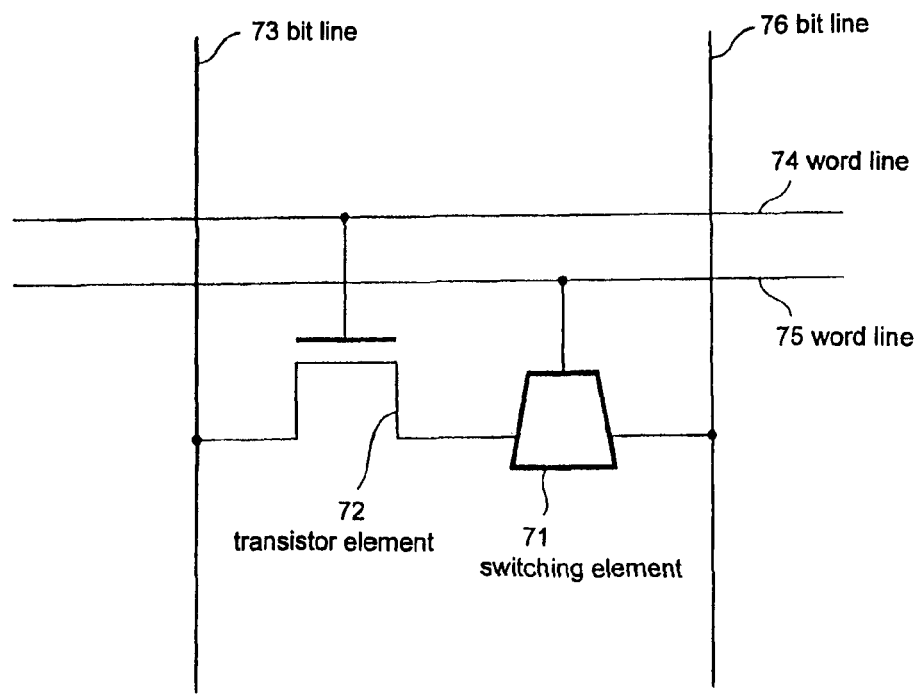
FIG. 10 is a schematic circuit diagram showing an example of the configuration in which the three-terminal switch of the present invention is applied in a memory element.

Explanation next regards the configuration of the memory element of the present working example. FIG. 10 is a schematic view showing an example of the configuration of a memory element.

As shown in FIG. 10, the memory element includes switching element 71 for saving information and transistor element 72 for reading the information of switching element 71. The three-terminal switch of the above-described embodiments is applied to this switching element 71. Switching element 71 has the same construction as a transistor made up of a drain electrode, source electrode and gate electrode, these electrodes corresponding to the first electrode, second electrode, and third electrode, respectively, of the three-terminal switch of the above-described working examples.

Transistor element 72 has its source electrode connected to bit line 73 and its gate electrode connected to word line 74. Switching element 71 has its source electrode connected to bit line 76 and its gate electrode connected to word line 75. The drain electrode of switching element 71 is then connected to the drain electrode of transistor element 72.

Explanation next regards the method of writing information to the memory element. Of the information "1" and "0" that is saved, the ON state of the switching element is assumed to be "1" and the OFF state is assumed to be "0." In addition, the switching voltage of the switching element is Vt and the operating voltage of transistor element 72 is VR.

When the information "1" is to be written to the memory element, voltage Vt is applied to word line 75 that is connected to the gate electrode of switching element 71 and the voltage of bit line 76 connected to the source electrode is set to 0 V. Voltage (Vt/2) is then applied to bit line 73. Switching element 71 enters the ON state, and the information "1" is thus written.

When the information "0" is to be written to the memory element, the voltage of word line 75 that is connected to the gate electrode of switching element 71 is set to 0 V, and voltage Vt is applied to bit line 76 that is connected to the source electrode. Voltage (Vt/2) is then applied to bit line 73, whereby switching element 71 enters the OFF state and the information "0" is written.

Explanation next regards the method of reading information saved in the memory element.

Voltage VR is applied to word line 74 to turn ON transistor element 72, and the resistance between bit line 73 and bit line 76 is then found. This resistance is the combined resistance of the ON resistance of transistor element 72 and switching element 71. Switching element 71 can be determined to be in the OFF state when this combined resistance is too large to measure, whereby the information saved in the memory element is understood to be "0." On the other hand, switching element 71 can be determined to be in the ON state when the combined resistance is less than a prescribed value, whereby the information saved in the memory element is understood to be "1."

The use of the three-terminal switch of the present invention in a switching element for saving information allows the switching voltage of the switching element to be set to a desired value, and the switching element maintains the set state despite the input to the gate electrode of noise having a voltage lower than the switching voltage. As a result, the switching element can be prevented from changing to information different from the written information, and the reliability of information saved in the memory element is improved. In addition, the two-terminal switch shown in the second working example can be applied to a memory element.

In the switching element of the present invention, the material forming electrodes that do not supply metal ions to the ion conduction layer (the first electrode and a portion of the second electrode) is not limited to platinum and may also be a refractory metal (Ta, Ti, W, and Mo) or a silicide (such as titanium silicide, cobalt silicide, and molybdenum silicide). In addition, the metal that forms electrodes that supply metal ions to the ion conduction layer (the third electrode and a portion of the second electrode) is not limited to copper and may also be, for example, silver or lead. Still further, in addition to compounds of metal and chalcogenides or halogenides, the ion conductor that forms the ion conduction layer may be, for example, a dielectric that contains silicon (silicon oxide, silicon nitride, and silicon oxide nitride) or a perovskite oxide ($ABO_3$, A:Mg, Ca, Sr, Ba, and B:Ti).

The present invention is not limited to the above-described working examples but is open to various modifications within the scope of the invention, and these modifications are of course included within the scope of the invention.

The invention claimed is:

1. A switching element comprising an ion conductor that can conduct metal ions, a first electrode, a second electrode, and a third electrode; wherein:
   said first electrode is of a configuration that includes a region composed of a material that does not supply said metal ions into said ion conductor;
   said second electrode and said third electrode are of a configuration in which at least one of said second electrode and said third electrode contacts said ion conductor, and of the electrodes that contact said ion conductor, at least one contains a material that can supply said metal ions into said ion conductor;
   said ion conductor contains any one of tantalum oxide, tungsten oxide, molybdenum oxide, titanium oxide, aluminum oxide, and silicon oxide; and
   an application of voltage to said third electrode controls an electrical connection state between said first electrode and said second electrode.

2. The switching element according to claim 1, wherein a portion that contacts said ion conductor of at least one of said second electrode and said third electrode is of a composition that can supply said metal ions into said ion conductor.

3. The switching element according to claim 1, wherein one or two electrodes of said first electrode, said second electrode, and said third electrode is provided on a substrate.

4. The switching element according to claim 3, wherein, above an electrode provided on the substrate, the other electrode is provided with at least one of said ion conductor and an insulating layer interposed.

5. The switching element according to claim 4, wherein the insulating layer is interposed between the ion conductor and the other electrode.

6. The switching element of claim 5, wherein the insulating layer includes a space through which a dendrite is formed.

7. The switching element according to claim 1, wherein at least the portion of said first electrode that contacts said ion conductor is of a composition that does not supply said metal ions into said ion conductor.

8. The switching element according to claim 1, wherein said ion conductor is stacked ion conduction layers realized by stacking a plurality of ion conduction layers having different ion mobility of metal ions.

9. The switching element according to claim 8, wherein:
   the ion conduction layers contained in said stacked ion conduction layers are two layers; and
   a ratio of film thicknesses of said two ion conduction layers corresponds to a switching voltage that is applied.

10. The switching element according to claim 1, wherein the second electrode includes a region composed of a material that does not supply the metal ions into the ion conductor.

11. A logic integrated circuit that uses the switching element according to claim 1 in a switch.

12. A memory element comprising:
a switching element according to claim 1; and
a transistor element for reading whether the switching element is in an ON state or in an OFF state.

13. The switching element according to claim 1, wherein said first electrode and said second electrode are provided on one surface of the ion conductor, and said third electrode is provided on an opposite surface of the ion conductor.

14. The switching element according to claim 1, wherein an application of voltage to said third electrode controls formation of a metal dendrite between said first electrode and said second electrode to control the electrical connection state between said first electrode and said second electrode.

15. The switching element according to claim 1, wherein a portion of said third electrode that contacts said ion conductor is of a composition that can supply said metal ions into said ion conductor.

16. A switching element comprising an ion conductor that can conduct metal ions, a first electrode, a second electrode, and a third electrode; wherein:
said first electrode, said second electrode, and said third electrode are provided in contact with said ion conductor;
said first electrode is of a configuration that includes a region composed of a material that does not supply said metal ions into said ion conductor;
at least one of said second electrode and said third electrode is of a configuration that includes a material that can supply said metal ions into said ion conductor;
said ion conductor contains any one of tantalum oxide, tungsten oxide, molybdenum oxide, titanium oxide, aluminum oxide, and silicon oxide; and
an application of voltage to said third electrode controls an electrical connection state between said first electrode and said second electrode.

17. The switching element according to claim 16, wherein a portion that contacts said ion conductor of at least one of said second electrode and said third electrode is of a composition that can supply said metal ions into said ion conductor.

18. The switching element according to claim 16, wherein one or two electrodes of said first electrode, said second electrode, and said third electrode is provided on a substrate.

19. The switching element according to claim 18, wherein, above an electrode provided on the substrate, the other electrode is provided with at least one of said ion conductor and an insulating layer interposed.

20. The switching element according to claim 19, wherein the insulating layer is interposed between the ion conductor and the other electrode.

21. The switching element of claim 20, wherein the insulating layer includes a space through which a dendrite is formed.

22. The switching element according to claim 16, wherein at least the portion of said first electrode that contacts said ion conductor is of a composition that does not supply said metal ions into said ion conductor.

23. The switching element according to claim 16, wherein said ion conductor is stacked ion conduction layers realized by stacking a plurality of ion conduction layers having different ion mobility of metal ions.

24. The switching element according to claim 23, wherein:
the ion conduction layers contained in said stacked ion conduction layers are two layers; and
a ratio of film thicknesses of said two ion conduction layers corresponds to a switching voltage that is applied.

25. The switching element according to claim 16, wherein the second electrode includes a region composed of a material that does not supply the metal ions into the ion conductor.

26. A method of driving a switching element, the switching element comprising an ion conductor that can conduct metal ions, a first electrode, a second electrode, and a third electrode; wherein said first electrode is of a configuration that includes a region composed of a material that does not supply said metal ions into said ion conductor; said second electrode and said third electrode are of a configuration in which at least one of said second electrode and said third electrode contacts said ion conductor, and of the electrodes that contact said ion conductor, at least one contains a material that can supply said metal ions into said ion conductor; said ion conductor contains any one of tantalum oxide, tungsten oxide, molybdenum oxide, titanium oxide, aluminum oxide, and silicon oxide, the method comprising:
applying a voltage to the first electrode so as to form a dendrite between the first electrode and the second electrode before an application of voltage to the third electrode,
applying a voltage to the third electrode so as to control an electrical connection state between said first electrode and said second electrode.

* * * * *